United States Patent
Reingruber et al.

(10) Patent No.: US 11,670,745 B2
(45) Date of Patent: Jun. 6, 2023

(54) METHOD FOR PRODUCING OPTOELECTRONIC SEMICONDUCTOR COMPONENTS, AND OPTOELECTRONIC SEMICONDUCTOR COMPONENT

(71) Applicant: Osram OLED GmbH, Regensburg (DE)

(72) Inventors: Klaus Reingruber, Langquaid (DE); Andreas Reith, Muenster (DE); Tobias Gebuhr, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 66 days.

(21) Appl. No.: 16/634,585

(22) PCT Filed: Jul. 18, 2018

(86) PCT No.: PCT/EP2018/069509
§ 371 (c)(1),
(2) Date: Jan. 28, 2020

(87) PCT Pub. No.: WO2019/020458
PCT Pub. Date: Jan. 31, 2019

(65) Prior Publication Data
US 2020/0212271 A1    Jul. 2, 2020
US 2020/0212271 A1    Jul. 2, 2020

(30) Foreign Application Priority Data
Jul. 28, 2017  (DE) ............... 10 2017 117 150.9

(51) Int. Cl.
*H01L 33/54*      (2010.01)
*H01L 33/50*      (2010.01)

(52) U.S. Cl.
CPC ............ *H01L 33/54* (2013.01); *H01L 33/507* (2013.01); *H01L 2933/005* (2013.01); *H01L 2933/0041* (2013.01)

(58) Field of Classification Search
CPC ........... H01L 2924/00014; H01L 33/62; H01L 2224/48091; H01L 33/486; H01L 2933/0033
See application file for complete search history.

(56) References Cited

U.S. PATENT DOCUMENTS 9,281,452 B2 *   3/2016  Nam ..................... H01L 33/486
2014/0042466 A1  2/2014  Hahn et al.
(Continued)

FOREIGN PATENT DOCUMENTS

CN   103477451 A   12/2013
CN   103875084 A    6/2014
(Continued)

OTHER PUBLICATIONS

DE102014"25939 [machine's translation].*
(Continued)

*Primary Examiner* — Tony Tran
(74) *Attorney, Agent, or Firm* — Viering Jentschura & Partner mbB

(57) ABSTRACT

A method for producing optoelectronic semiconductor components may include applying optoelectronic semiconductor chips for generating radiation to a carrier, producing a potting around the semiconductor chips with a potting top side facing away from the carrier such that the semiconductor chips remain free of a reflective potting material. The potting has trenches between the semiconductor chips, and the trenches are arranged at a distance from the semiconductor chips; the trenches do not touch the semiconductor chips. The method may further include filling the trenches
(Continued)

with a supporting material to form at least one supporting body and leaving the potting alongside the trenches free of the supporting material.

17 Claims, 11 Drawing Sheets

(56) References Cited

U.S. PATENT DOCUMENTS

| | | |
|---|---|---|
| 2015/0048408 A1 | 2/2015 | Nam et al. |
| 2015/0221623 A1* | 8/2015 | Tischler .............. H01L 33/0095 |
| | | 257/89 |
| 2016/0172546 A1* | 6/2016 | Moosburger ............ H01L 33/60 |
| | | 257/98 |
| 2016/0181491 A1 | 6/2016 | Sabathil et al. |
| 2016/0233200 A1 | 8/2016 | Pindl et al. |
| 2016/0351509 A1* | 12/2016 | Dang .................. H01L 25/0655 |
| 2017/0244011 A1 | 8/2017 | Schlosser et al. |
| 2017/0271610 A1* | 9/2017 | Takahashi ........... H01L 51/5012 |
| 2018/0226514 A1* | 8/2018 | Etschmaier ........... H01L 31/173 |

FOREIGN PATENT DOCUMENTS

| | | |
|---|---|---|
| CN | 105409012 A | 3/2016 |
| CN | 105612624 A | 5/2016 |
| DE | 102007041926 A1 | 3/2009 |
| DE | 102011078906 A1 | 1/2013 |
| DE | 102012212963 A1 | 2/2014 |
| DE | 102014215939 A1 | 2/2016 |

OTHER PUBLICATIONS

German search report issued for the corresponding DE application No. 10 2017 117 150.9, dated May 16, 2018, 20 pages (for informational purposes only).

International search report issued for the corresponding PCT application No. PCT/EP2018/069509, dated Oct. 24, 2018, 15 pages (for informational purposes only).

Office Action for the corresponding CN Patent Application No. 20188050405.2, dated Sep. 7, 2022 15 pages (For reference purposes only).

* cited by examiner

A)

B)

C)

D)

E)

F)

A)

B)

C)

D)

E)

A)

B)

C)

A)

B)

A)

B)

A)

B)

A)

B)

A)

B)

A)

B)

METHOD FOR PRODUCING OPTOELECTRONIC SEMICONDUCTOR COMPONENTS, AND OPTOELECTRONIC SEMICONDUCTOR COMPONENT

CROSS-REFERENCE TO RELATED APPLICATIONS

The present application is a national stage entry according to 35 U.S.C. § 371 of PCT application No. PCT/EP2018/069509 filed on Jul. 18, 2018; which claims priority to German Patent Application Serial No. 10 2017 117 150.9, which was filed on Jul. 28, 2017; which is incorporated herein by reference in its entirety and for all purposes.

TECHNICAL FIELD

A method for producing optoelectronic semiconductor components is disclosed. In addition, an optoelectronic semiconductor component is disclosed.

BACKGROUND

An object to be achieved is that of providing optoelectronic semiconductor components that have high mechanical stability and emit radiation with high contrast.

SUMMARY

According to at least one embodiment, the optoelectronic semiconductor component is designed for the emission of radiation, in particular visible light. In particular, a color of the light radiated by the semiconductor component during operation can be set. The semiconductor component may therefore be at least one picture element or pixel, which is designed for differently colored emission of light. The semiconductor components are in particular light-emitting diodes, LEDs for short.

According to at least one embodiment, the method includes the step of applying optoelectronic semiconductor chips to a carrier. The semiconductor chips are designed for generating radiation. In particular, the semiconductor chips are light-emitting diode chips, LED chips for short. The semiconductor chips within a semiconductor component may be structurally identical or designed for differently colored emission.

The carrier may be a temporary or permanent carrier. In the case of a temporary carrier, it is configured for example as a film. In the case of a permanent carrier, it is for example a circuit board, for instance a printed circuit board based on a plastics material or a metal core plate or a ceramic substrate with conductor tracks. Similarly, the permanent carrier may be a leadframe, so that the finished semiconductor component is for example a QFN component.

According to at least one embodiment, the method includes the step of producing a potting. The potting is produced in particular by means of transfer molding or injection molding or compression molding. Such methods are also referred to as molding. The potting has a potting top side facing away from the carrier.

According to at least one embodiment, the potting is produced directly around the semiconductor chips. That is to say that, when seen from above, the semiconductor chips may be surrounded all around by a continuous strand of a potting material of the potting. In this case, the potting is in direct contact with the semiconductor chips, so that the semiconductor chips are directly enclosed by the potting.

According to at least one embodiment, the semiconductor chips, when seen from above, are free of the potting material of the potting. Alternatively, it is possible that the semiconductor chips are covered by a thin layer of the potting material, for example with a thickness of at most 10 μm or 5 μm. In a non-limiting embodiment, however, the side of the semiconductor chips and/or of an optional phosphor body that is facing away from the carrier is free of the potting material.

According to at least one embodiment, the potting, and consequently the potting material, is reflective with respect to the radiation generated by the semiconductor chips during operation. In particular, the potting appears white to a viewer. The potting material is for instance a silicone to which reflective particles, for example of a metal oxide such as titanium oxide, have been added.

According to at least one embodiment, the potting is produced with trenches. The trenches lie between at least some adjacent semiconductor chips or between groups of semiconductor chips combined in particular into picture elements. In this case, the trenches are kept at a distance from the associated semiconductor chips. That is to say that in this case the trenches are not in contact with the semiconductor chips. Between the trenches and the associated semiconductor chips, there is potting material continuously.

According to at least one embodiment, the method includes the step of filling the trenches with a supporting material. At least one supporting body is formed by the supporting material. In the finished, hardened state, the supporting material has a higher specific mechanical stability than the potting material. For example, the supporting material is an epoxy. The supporting material may include a matrix material, such as an epoxy, and a fiber reinforcement, such as of glass fibers, and optionally include or consist of further components, such as color particles.

According to at least one embodiment, the potting alongside the trenches remains free of the supporting material. That is to say that, seen from above, the supporting material for the supporting body or for the supporting bodies may be confined to the trenches. The supporting body has the effect of increasing a mechanical stability of the finished semiconductor components, in comparison with semiconductor components without such trenches filled with the supporting material, in the case of which, instead of the supporting material, just the potting material is present.

According to at least one embodiment, the method includes the step of singulating into the semiconductor components. The singulation takes place at least through the supporting body. If the carrier is a permanent carrier, the carrier is also affected by the singulation. Similarly, the potting may be affected by the singulation. The singulation is carried out for example by means of sawing, laser cutting, breaking, cutting and/or milling.

In at least one embodiment, the method serves for producing optoelectronic semiconductor components and includes the following steps, such as in the sequence indicated:

A) applying optoelectronic semiconductor chips for generating radiation to a carrier, B) producing a potting, with a potting top side facing away from the carrier, directly around the semiconductor chips, so that the semiconductor chips, seen from above, remain free of a reflective potting material of the potting and so that the potting has trenches between the semiconductor chips, C) filling the trenches with a supporting material, so that at least one supporting body is formed and the potting alongside the trenches remains free of the supporting material, and D) singulating into the semiconductor components, for example at least through the supporting body.

With the semiconductor components described here, a higher contrast can be achieved without mechanical weak points occurring. By contrast, in the case of conventional semiconductor components, the semiconductor chips are only encapsulated in a highly reflective material such as a silicone, which however is comparatively soft and consequently does not offer sufficient mechanical protection. Alternatively, prefabricated packages that have a recess in which semiconductor chips are mounted may be used. However, such prefabricated packages are comparatively expensive.

In the case of the method described here, the semiconductor chips are subjected to a forming process, for example with a molding compound based on white silicone, in particular by a first potting step. This step may already be used to form the trenches, while the semiconductor chips can be located at the distance from one another required for the contrast. However, this molding compound that can be used for the first potting optically has insufficient absorption and/or reflectivity to satisfy the contrast requirements demanded. Therefore, in a second potting step, the at least one supporting body is produced, in order to fill the trenches that may be produced in the first potting step. In this case, a material different from the supporting material is used, a material with which the requirements demanded for the optical contrast can be satisfied and which has an increased mechanical stability.

Consequently, overpotting can be reduced. Furthermore, there is an increased mechanical stability, in particular in comparison with bulk material processes, since the supporting material for the supporting bodies has to satisfy lower requirements with regard to the optical properties, and therefore can be optimized in terms of mechanical properties. Furthermore, both potting steps, that is to say producing the potting and filling the trenches, can be carried out at the panel level, whereby parallel processing and cost savings are achievable.

According to at least one embodiment, the trenches penetrate the potting by at least 30% or 40% or 50% in a direction perpendicular to the carrier and from the potting top side. It is possible that the trenches penetrate the potting completely, and therefore reach from the potting top side as far as the carrier. Alternatively or in addition, the trenches penetrate the potting from the potting top side by at most 90% or 80% or 70%. In a non-limiting embodiment, the trenches have a depth of between 50% and 70%, inclusive, of a thickness of the potting.

According to at least one embodiment, a lateral distance between the semiconductor chips and the trenches on the potting top side is at least 30 μm or 50 μm or 80 μm. Alternatively or in addition, this distance is at most 250 μm or 150 μm or 100 μm.

According to at least one embodiment, the potting is partially permeable on the potting top side with respect to the radiation generated by the semiconductor chips during operation. In particular, a transmissivity of the potting directly on the potting top side, and in particular in a direction parallel to the potting top side, with respect to the radiation generated is at least 0.2% or 0.5% or 1%. Alternatively or in addition, this transmissivity is at most 10% or 5% or 3%, in particular between 1% and 3%, inclusive. That is to say that, in the finished semiconductor components, a comparatively great proportion of the radiation can reach the supporting body through the potting.

According to at least one embodiment, the supporting body is absorbent with respect to the radiation generated during operation. In particular, the supporting body appears gray or black to a viewer. For example, an absorption coefficient of the supporting body with respect to the radiation is at least 0.7 or 0.8 or 0.9 or 0.95. The supporting body is for example produced from an epoxy to which absorbent particles, for instance of carbon black, have been added.

Alternatively, the supporting body may have high reflectivity. In this case, it is possible that the supporting body is provided with a reflective coating or is formed from a reflective material, such as a metal.

According to at least one embodiment, the supporting material has a modulus of elasticity that is higher by at least a factor of 1.5 or 2 or 4 than the potting material. This applies in particular at room temperature, that is to say 296 K.

According to at least one embodiment, with step A) phosphor bodies are mounted on chip top sides of the semiconductor chips that are facing away from the carrier. It is possible that a phosphor body is respectively assigned to each or most of the semiconductor chips. In this case, there is a one-to-one assignment between the semiconductor chips and the phosphor bodies. Alternatively, it is possible that one phosphor body is arranged downstream of a number of semiconductor chips together or that a number of phosphor bodies are arranged downstream of one semiconductor chip. The phosphor bodies are designed for partial or complete conversion of the radiation generated by the semiconductor chips into radiation of a longer wavelength.

If the semiconductor chips emit blue light, white mixed light can be generated overall by means of the phosphor bodies. In the case of a full conversion of the radiation of the semiconductor chips by the phosphor bodies, for example blue light and green light and red light may be generated. In this case, the semiconductor chips may emit near-ultraviolet radiation or blue light. If the semiconductor chips emit blue light, it is possible that, instead of a phosphor body, on some of the semiconductor chips there is applied a transmission body, which acts either as transparent or dispersive with respect to the blue light and can be free of any phosphor. This allows an RGB image to be built up, either by means of red-, blue- and green-emitting phosphors or by means of blue-emitting semiconductor chips together with red-emitting and green-emitting phosphors.

According to at least one embodiment, the phosphor body and/or the supporting body and/or the transmission body finish flush with the potting top side. That is to say that a common plane may be formed by the potting top side together with the supporting body and the phosphor body and the transmission body. In particular, the potting does not extend beyond the phosphor body or beyond the supporting body or beyond the transmission body, and vice versa.

According to at least one embodiment, in places the potting is applied directly to the carrier. In particular, the carrier may be covered completely by the potting together with the semiconductor chips and/or the phosphor bodies, optionally together with electrical connecting means for the semiconductor chips such as bonding wires.

According to at least one embodiment, the potting is produced in step B) by means of film-assisted transfer molding or film-assisted injection molding, also referred to as FAM or film-assisted molding. In this case, the trenches are already formed with the injection molding or transfer molding, so that no potting material is subsequently removed in order to form the trenches.

According to at least one embodiment, in step B) one or more anchoring structures are respectively formed in the trenches on the potting. The anchoring structures have the effect of increasing a bonding attachment of the supporting body to the potting in step C). The anchoring structures are formed for example by nubs, elevations and/or ridges, which may extend within the trenches and/or along the trenches.

According to at least one embodiment, step B) includes two sub-steps B1) and B2), which follow one another in the sequence indicated. In sub-step B1), the potting is produced with a uniform thickness. That is to say that in step B1) there are not yet any trenches. Subsequently, in sub-step B2) the at least one trench is formed by removing the potting material in places. This removal involves sawing, alternatively a laser process or grinding or milling or etching. By such removal of the potting material, trench side walls of the trenches that run perpendicularly or virtually perpendicularly in relation to the potting top side can be realized. The trenches then only penetrate the potting incompletely.

According to at least one embodiment, when producing the trenches, in particular by means of sawing, a roughening is formed. The roughening has for example an average roughness of at least 5 µm or 10 µm or 20 µm and/or of at most 50 µm or 40 µm or 30 µm. In other words, the potting is comparatively rough at the trenches. The roughness in the trenches exceeds a roughness on the potting top side for example by at least a factor of 5 or 10 or 20. Such roughening in the trenches has the effect of increasing a bonding attachment of the supporting material to the potting.

According to at least one embodiment, the side walls of the trenches form an angle of at least 90° or 95° or 105° with the potting top side. Alternatively or in addition, this angle is at most 140° or 135° or 125°. In other words, the side walls may run perpendicularly or virtually perpendicularly to the potting top side or form a comparatively great angle in relation to the potting top side. In particular, comparatively great angles allow demolding drafts to be realized for a compression mold.

According to at least one embodiment, a peripheral rounding is formed along edges of the trenches in step B). A radius of curvature of the peripheral rounding is for example at least 5 µm or 10 µm or 20 µm and/or at most 100 µm or 50 µm or 30 µm.

According to at least one embodiment, the trenches are additionally roughened after step B) and before step C). In this way, a roughness of the trenches can be increased, combined with an increased bonding of the supporting material to the potting. This roughening is possible for example by sandblasting, also referred to as blasting.

According to at least one embodiment, in step C) the trenches are filled flush and completely with the supporting material. That is to say that the supporting material does not protrude out of the trench. Consequently, a contiguous plane is formed by the potting top side and a top side of the supporting bodies that is facing away from the carrier.

According to at least one embodiment, the carrier has one or more anchoring elements in the region of the trenches. The at least one anchoring element has the effect of increasing a bonding attachment of the supporting body to the carrier. Such anchoring elements can be realized for example by holes in a metal layer in the region of the trenches.

According to at least one embodiment, before step D), the trenches, seen from above, extend contiguously over a number of the later semiconductor components. As a result, the trenches can be efficiently filled with the supporting material in step C), and a number of injection points can be reduced.

According to at least one embodiment, precisely one supporting body per trench is formed. It is additionally possible that adjacent trenches neither touch nor intersect.

According to at least one embodiment, the trenches have a multiplicity of branches in a direction transverse to a longitudinal direction. The branches may be formed only to one side or extend on both sides of the longitudinal direction. It is possible that H-shaped structures linked together along the longitudinal direction are formed by the branching.

According to at least one embodiment, the semiconductor chips, seen from above, are surrounded on one, on three or on four sides by the related, assigned trenches and also together with the two or four associated branches. That is to say that, in the finished semiconductor components, the supporting body is in particular designed in a U-shaped manner, seen from above, while there may be one or two of these U-shaped trenches per semiconductor component.

According to at least one embodiment, in step D) singulating takes place along at least one singulation line, which runs completely alongside the trenches. That is to say that the supporting bodies are not affected by this singulation line. This singulation line may run completely through the potting and optionally through the carrier.

According to at least one embodiment, at least up until step C) and optionally also in the finished semiconductor components, the semiconductor chips are grouped into picture elements or pixels. The picture elements are designed for variable, colored light emission. Within the picture elements, the semiconductor chips may be electrically activatable independently of one another. In a non-limiting embodiment, there is no trench between the semiconductor chips and/or within the picture elements. In other words, the semiconductor chips within the picture elements and/or the semiconductor components may be connected to one another by a contiguous, uninterrupted potting top side.

In addition, an optoelectronic semiconductor component is specified. The semiconductor component is produced in particular by a method as described in conjunction with one or more of the aforementioned embodiments. Features of the semiconductor component are therefore also disclosed for the method, and vice versa.

In at least one embodiment, the optoelectronic semiconductor component includes a carrier, which includes electrical contact areas. Furthermore, the semiconductor component includes one or more optoelectronic semiconductor chips for generating radiation, which are mounted on the carrier, in particular on the electrical contact areas. Formed directly around the semiconductor chips is a potting with a potting top side facing away from the carrier, so that the semiconductor chips, seen from above, are free of a reflective potting material of the potting. There is at least one trench in the potting, while the trench may be kept at a distance from the semiconductor chips. At least one supporting body in the trench is confined to the trench and does not touch the semiconductor chips.

In a non-limiting embodiment, precisely three side faces of the semiconductor component, optionally all four side faces, are partially formed by the supporting body. A component top side of the semiconductor component may be formed by the potting together with the supporting body and the semiconductor chip, alternatively the phosphor body or the transmission body. A component bottom side of the semiconductor component is formed exclusively by the carrier.

A method described here and an optoelectronic semiconductor component described here are explained in more detail below on the basis of exemplary embodiments with reference to the drawings. The same designations indicate here the same elements in the individual figures. However, relative sizes are not shown to scale here, but rather individual elements may be shown over-enlarged for better understanding.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1:
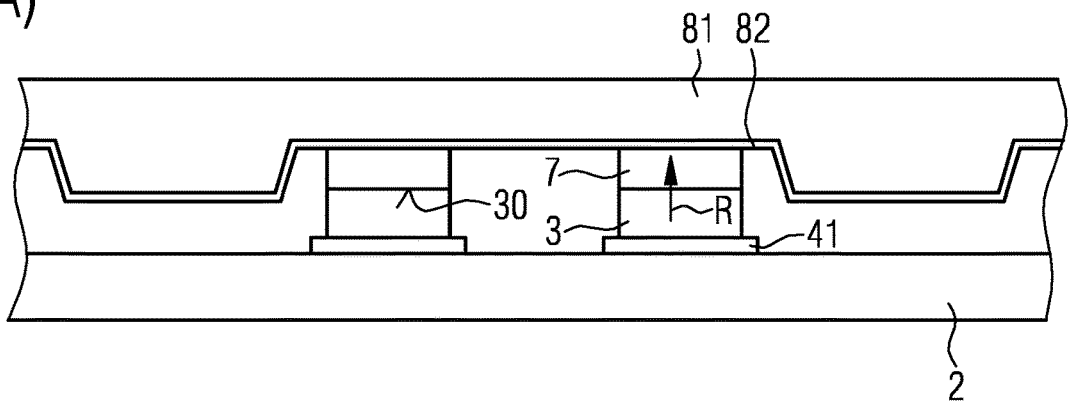
FIGS. 1 to 3 show schematic sectional representations of method steps of a method described here for producing exemplary embodiments of optoelectronic semiconductor components.
Figure 1:
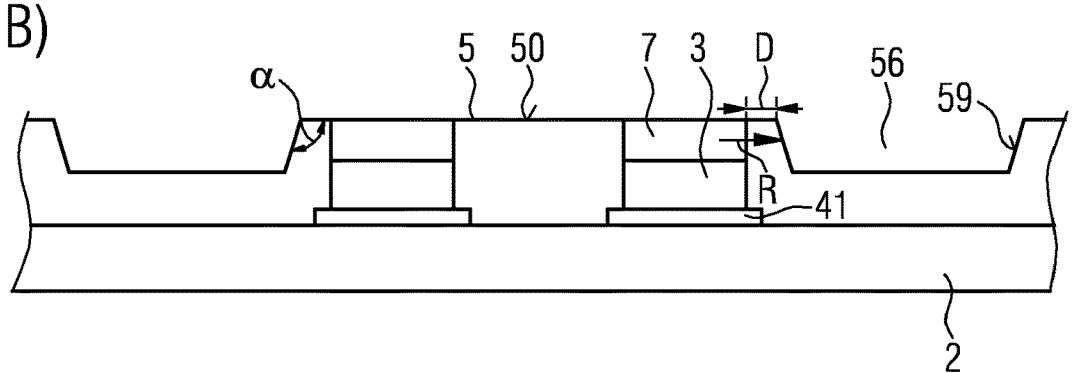
Figure 1:
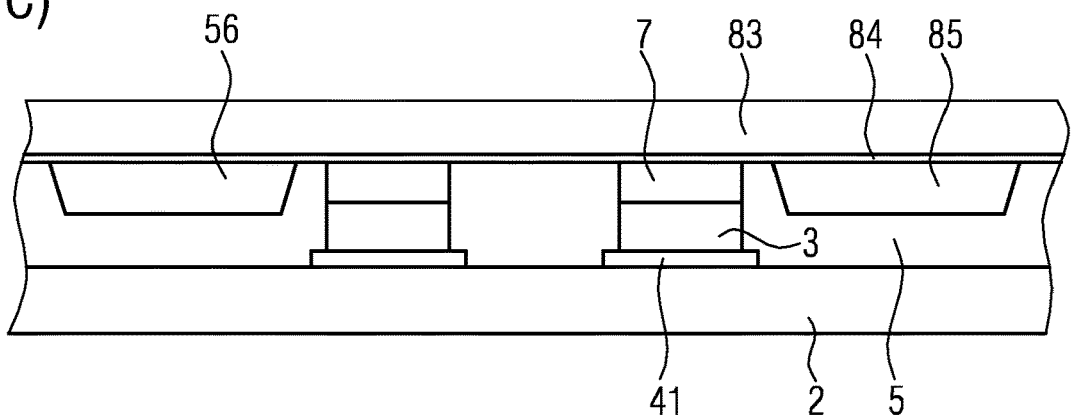
Figure 1:
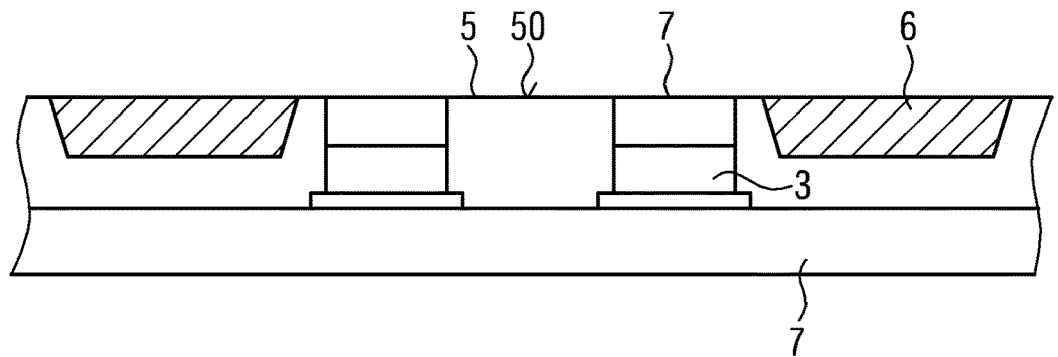
Figure 1:
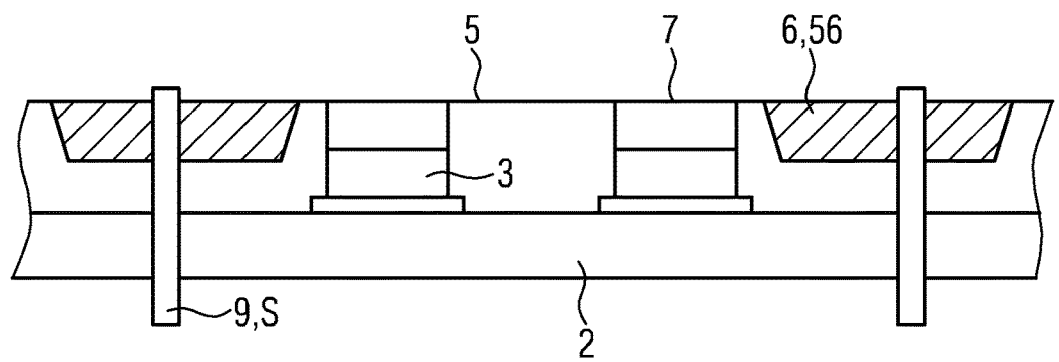
Figure 1:
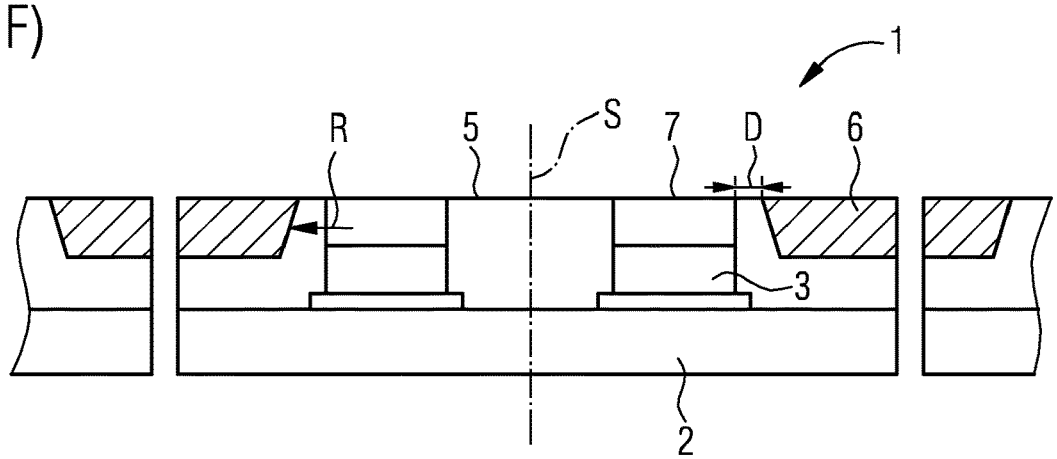

In FIG. 1, an exemplary embodiment of a method for producing optoelectronic semiconductor components 1 is illustrated. According to FIG. 1A, a carrier 2, which includes electrical contact areas 41, is provided. The carrier 2 is based for example on a ceramic. On the electrical contact areas 41 there are applied optoelectronic semiconductor chips 3, in particular LED chips. In a non-limiting embodiment, on chip top sides 30 facing away from the carrier 2 there are in each case phosphor bodies 7 or transparent bodies without wavelength conversion properties. The phosphor bodies 7 are designed for the conversion of radiation R generated in the semiconductor chips 3.

In the method step as shown in FIG. 1A, the semiconductor chips 3 are in a cavity that is formed by the carrier 2 together with a compression mold 81. On the compression mold 81 there is a sheet molding compound 82. In this way, also see FIG. 1B, a potting 5 can be produced by means of compression molding or injection molding or transfer molding. In this case, the compression mold 81 has protuberances, so that the potting 5 is produced with trenches 56. The trenches 56 may extend continuously through the potting 5 in a direction perpendicular to the plane of the drawing.

The trenches 56 reach from a potting top side 50 facing away from the carrier 2 to approximately 50% to 60% of the way through the potting 5. Side walls 59 of the trenches 56 have an angle α of approximately 120° in relation to the potting top side 50, so that the compression mold 81 can be removed efficiently. The potting top side 50 finishes flush with top sides of the phosphor bodies 7 that are facing away from the carrier 2. A distance D on the potting top side 50 between the phosphor bodies 7 and the trenches 56 is between 80 µm and 100 µm. On account of this small distance D, the radiation R generated in the semiconductor chips 3 during operation partially passes through the finished potting 5 to the trenches 56.

A potting material for the potting 5 is for example a silicone that is approximately 30% by weight filled with titanium dioxide particles. A thickness of the electrical contact areas 41 is for example at least 20 µm and/or at most 70 µm, in particular around 50 µm. A thickness of the potting 5 from the carrier 2 to the potting top side 50 is for example at least 150 µm and/or at most 400 µm, in particular around 250 µm.

In the method step of FIG. 1C, a further compression mold 83 with a further sheet molding compound 84 is mounted on the potting 5, so that cavities 85 are formed by the trenches 56 together with the further compression mold 83.

These cavities 85 are filled with a supporting material for supporting bodies 6, also see FIG. 1D. The supporting bodies 6 finish flush with the potting top side 50 and fill the trenches 56 completely. One supporting body 6 per trench 56 is produced.

In the method step of FIG. 1E, singulating takes place along singulation lines S through the carrier 2, the potting 5 and the supporting bodies 6. This singulation takes place along the trenches 56. For example, the singulation is carried out by means of a saw blade 9.

In FIG. 1F, the finished semiconductor components 1 are represented. On account of the small distance D, during operation a proportion of the radiation R reaches the supporting body 6 and is absorbed there. The supporting body 6 appears black.

Optionally, there may be a further singulation line S, which lies between adjacent semiconductor chips 3. This additional singulation line S is confined to the carrier 7 and the potting 5, so that the supporting bodies 6 are not affected by this further singulation line S.

Figure 2:
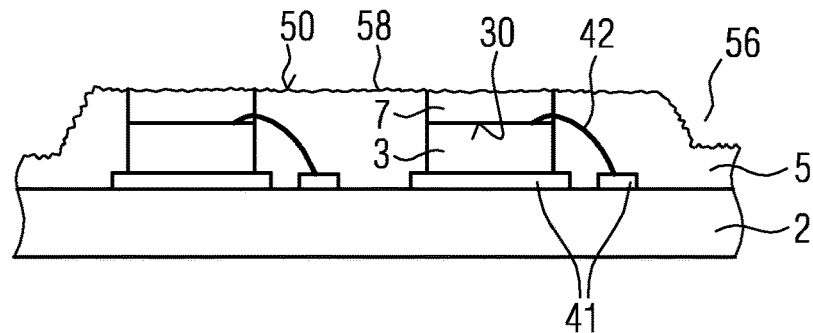
Figure 2:
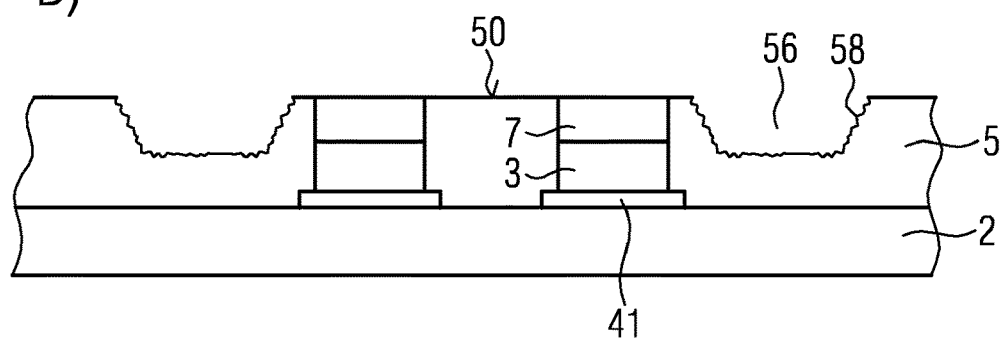
Figure 2:
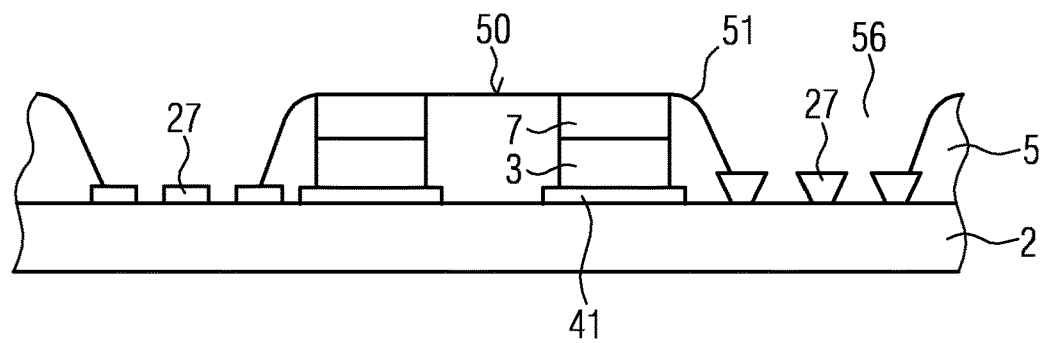
Figure 2:
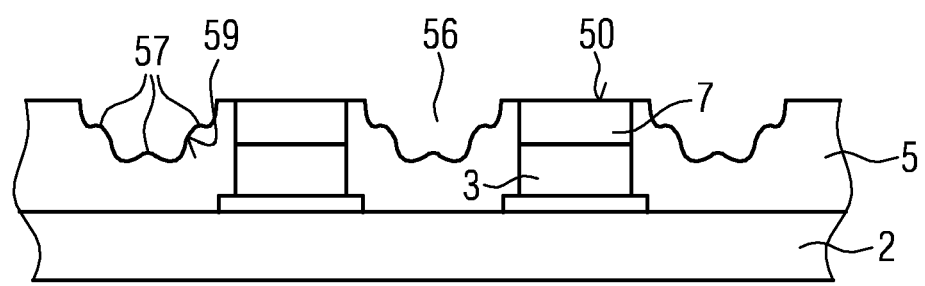
Figure 2:
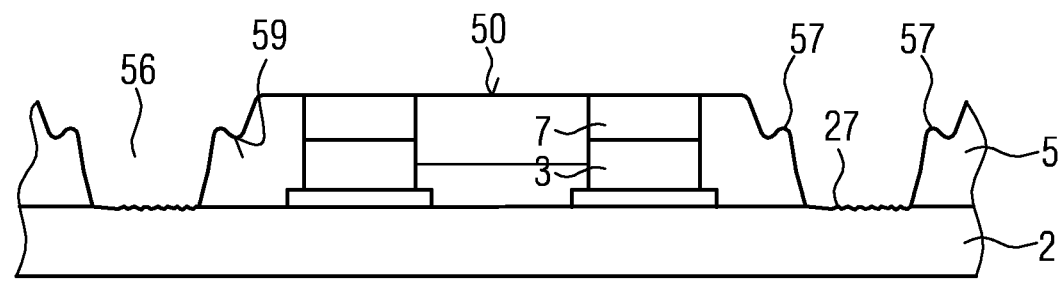

In FIGS. 2A and 2B, optional additional method steps are shown, which can take place between the method steps of FIGS. 1B and 1C. According to FIG. 2A, a roughening 85 is produced, for example by means of sandblasting, continuously over the potting 5 and optionally also over the phosphor bodies 7. This roughening 85 may have the subsequent effect of increasing a bonding attachment of the supporting body 6 to the potting 5. Moreover, it is possible that a coupling-out of radiation from the phosphor bodies 7 is increased.

As also in all of the other embodiments, it is possible that contacting of the semiconductor chips 3 takes place on the chip top sides 30 with the aid of bonding wires 42, which are led through the phosphor body 7 and/or the potting 5 to the contact areas 41. Alternatively, as illustrated in FIG. 1, flip-chips may also be used in each case.

Unlike in FIG. 2A, the roughening 58 according to FIG. 2B is confined to the trenches 56.

FIGS. 2C to 2E concern variants in which there are anchoring structures 57 and/or anchoring elements 27, by which a bonding attachment of the supporting body 6 to the carrier 2 and/or to the potting 5 can be increased. The steps of FIGS. 2C to 2E each correspond in particular to the step of FIG. 1B.

In FIG. 2C it is shown that on the carrier 2 there are a number of anchoring elements 27. The anchoring elements 27 are formed for example by a metal layer or ceramic layer or plastic layer provided with holes. These holes may be cylindrical, as illustrated in the left half of FIG. 2C, or inversely conical or trapezoidal, as shown in the right half of FIG. 2C. Such anchoring elements 27, provided with undercuts, can be produced for example by etching of an initial layer.

Furthermore, as also in all of the other exemplary embodiments, it is possible that, at edges of the trenches 56, there are in each case peripheral roundings 51. A radius of curvature of the peripheral roundings 51 is for example 20 µm.

According to FIG. 2D, anchoring structures 57 are formed on the potting 5 in the trenches 56, for instance by an appropriately designed compression mold 51 in the step corresponding to FIG. 1A. The anchoring structures 57 may be mounted on the side walls 59 and/or on an underside of the trenches 56 that is closest to the carrier 2. The anchoring structures 57 are formed for example by ridges which extend along the trenches 56, and/or by individual, dome-shaped nubs, a number of which may be arranged in series along the trenches 56.

In FIG. 2E, it is illustrated that the anchoring structures 57 in particular on the side walls 59 may be combined with the anchoring elements 27 on the carrier 2. In this case, as also in all of the other exemplary embodiments, it is possible that the anchoring elements 27 are formed by a roughening of the carrier 2. That is to say that the anchoring elements 27 do not have to rise up from the carrier 2 but may be incorporated in the carrier 2.

In FIGS. 2C and 2E, the trenches 56 reach as far as the carrier 2, so that the anchoring elements 27 are free of the potting 5.

Figure 3:
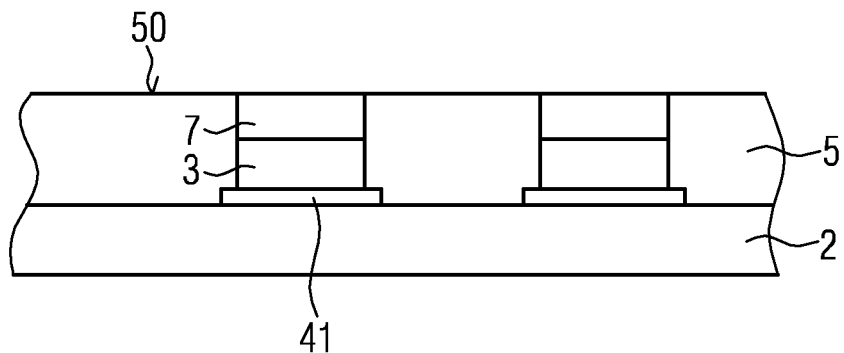
Figure 3:
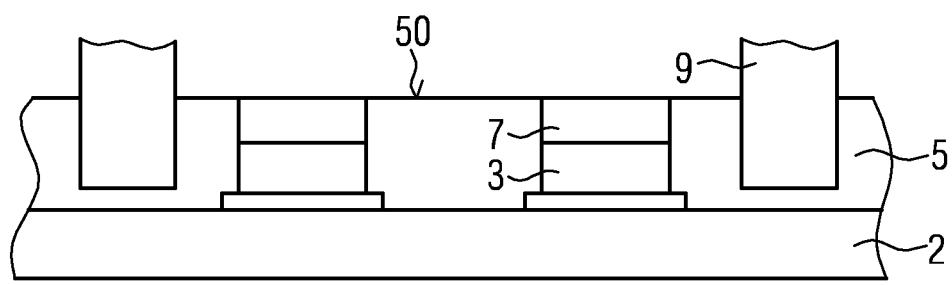
Figure 3:
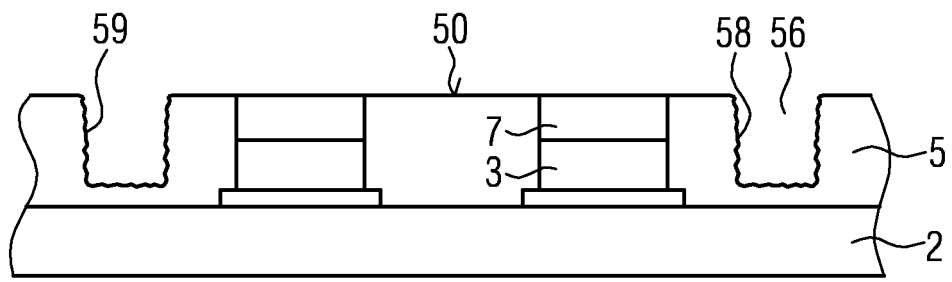

In FIG. 3, an alternative to the forming of the potting 5 with the trenches 56 is illustrated. The steps of FIGS. 3A to 3C may replace the steps shown in FIGS. 1A and 1B. Otherwise, the statements made in relation to FIG. 1 apply correspondingly.

According to FIG. 3A, the potting 5 is produced with the continuous potting top side 50. Consequently, after this step there are still no trenches.

According to FIG. 3B, a removal of material of the potting 5 takes place in the region of the later trenches. This is carried out in particular by means of a saw blade 9. The trenches 56 do not reach as far as the carrier 2. Alternatively, it is possible, in particular in the case of an only temporary carrier 2, that the trenches 56 also reach as far as or into the carrier 2.

The resulting trenches 56 are illustrated in FIG. 3C. The side walls 59 of the trenches 56 are oriented perpendicularly or virtually perpendicularly to the potting top side 50, so that the angle α is at 90°. In a non-limiting embodiment, a roughening 58, for example with a roughness of between 10 µm and 30 µm, is produced in the trenches 56 by the sawing in the step of FIG. 3B. This roughening 58 has the effect that the supporting material for the supporting bodies 6 bonds more strongly to the potting 5. The other method steps can be carried out analogously to FIG. 1.

Figure parts A of FIGS. 4 to 7 relate to panels before singulation, that is to say to the arrangement after the method step corresponding to FIG. 1D. Figure parts B respectively concern perspective representations of the finished semiconductor components 1 after the step of FIG. 1F.

As shown in FIG. 4A, the semiconductor chips 3a, 3b, 3c may be respectively grouped into picture elements 33. In this case, the semiconductor chips 3a, 3b, 3c may touch or almost touch and may be arranged in series along a line parallel to the longitudinal directions of the supporting bodies 6. The supporting bodies 6 extend along straight lines between adjacent picture elements 33 over the panel formed by the carrier 2 and the potting body 5. In this case, the supporting bodies 6 within the semiconductor components 1 are each only mounted on one side of the picture elements 33, on which the strip wires 42 are not located. Seen from above, in the finished semiconductor components the supporting body 6 is consequently only on a single side of the picture elements 33.

One of the singulation lines S runs along the respective supporting body 6, another singulation line S, running parallel thereto, only runs through the potting 5 together with the carrier 2. A third singulation line S, which is schematically indicated in FIG. 4A, runs through between adjacent groups of picture elements 33 perpendicularly to the two first-mentioned singulation lines.

Consequently, the supporting body 6 in the finished semiconductor components 1, see FIG. 4B, has a bar-shaped design. The supporting body 6 is exposed on three side faces 15 of the semiconductor components 1. The side faces 15 may consist of the carrier 2, the supporting body 6 and also the potting 5.

According to FIG. 5A, the supporting bodies 6 each have, seen from above, a number of branches 55 perpendicularly to their longitudinal directions. Consequently, the supporting bodies 6, for each semiconductor component 1, are designed as U-shaped, seen from above, and, as long as they are not yet singulated, are formed as lying Hs linked-together along the longitudinal directions.

The semiconductor chips 3 may, as also in all other exemplary embodiments, be grouped in a square-shaped manner into the picture elements 33, for example as RGGB pixels.

Figure 5:
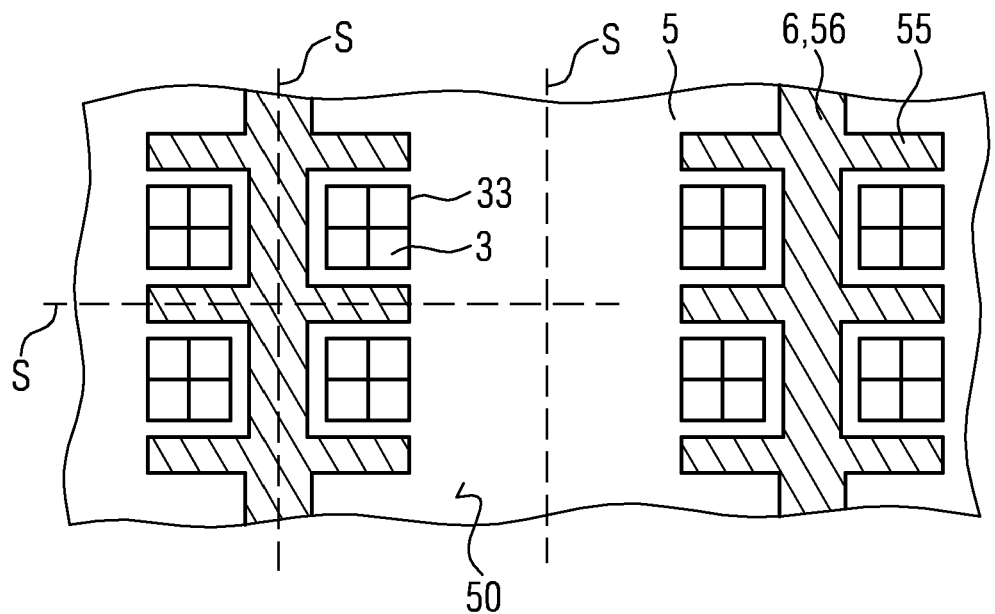
Figure 5:
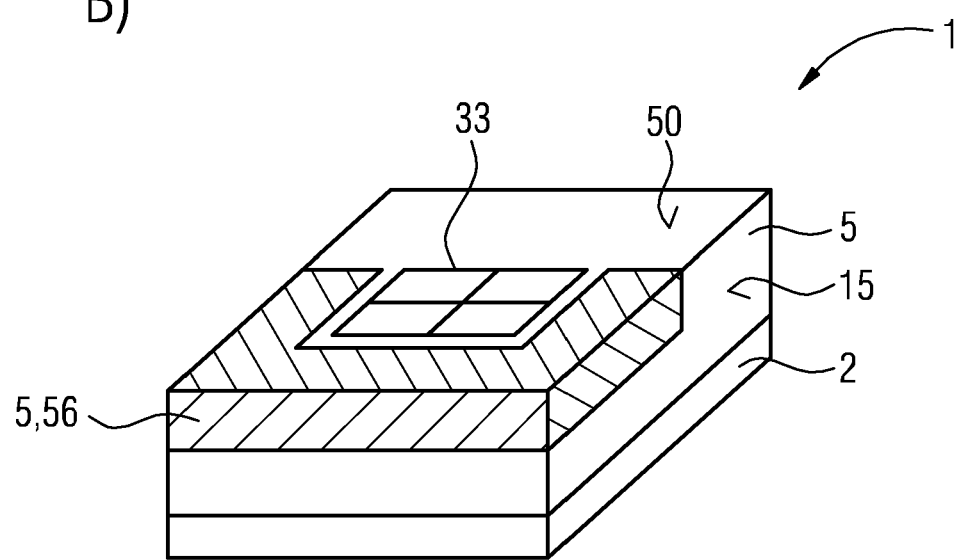
Figure 6:
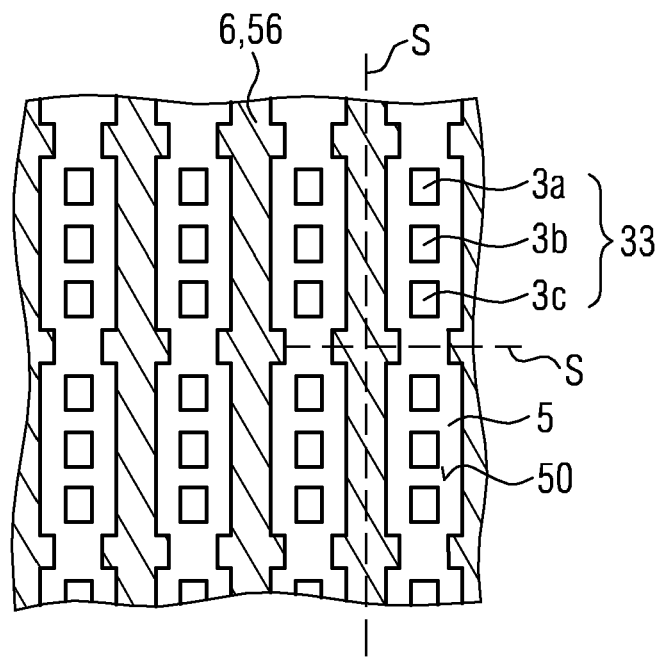
Figure 6:
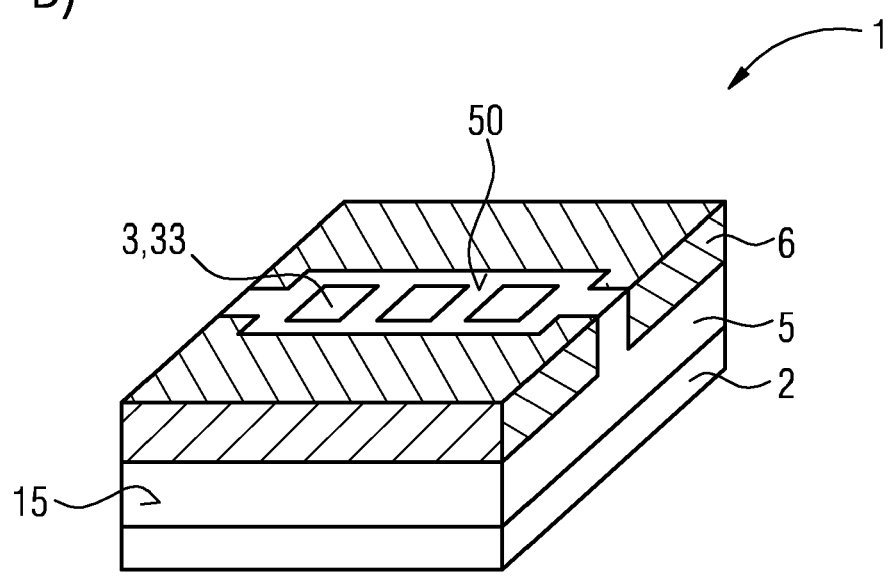

In the case of the exemplary embodiment of FIG. 6, each picture element 33 is assigned two of the supporting bodies 6 from FIG. 5. In this way, the for example individually mounted semiconductor chips 3a, 3b, 3c that are grouped to form the picture elements 33 are enclosed on both sides by the supporting bodies 6 that are U-shaped when seen from above. It is possible that, parallel to the supporting bodies 6, the potting 5 also extends, seen from above, as a continuous strip over the panel of FIG. 6A.

Figure 7:
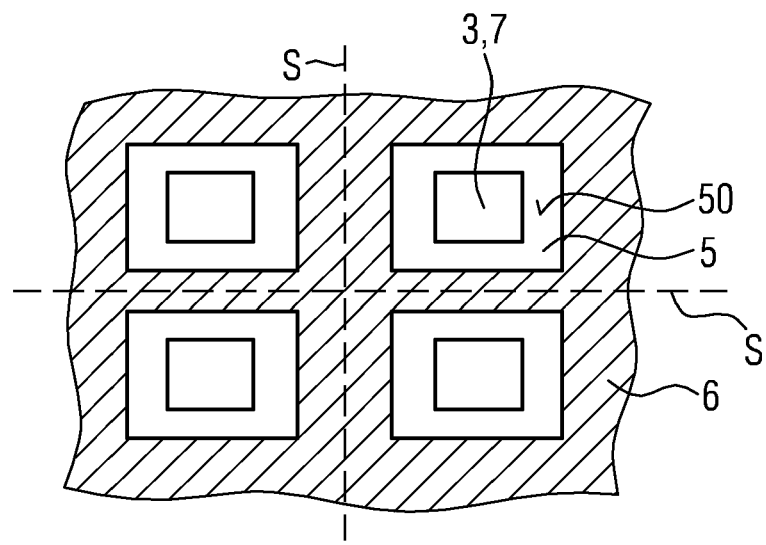
Figure 7:
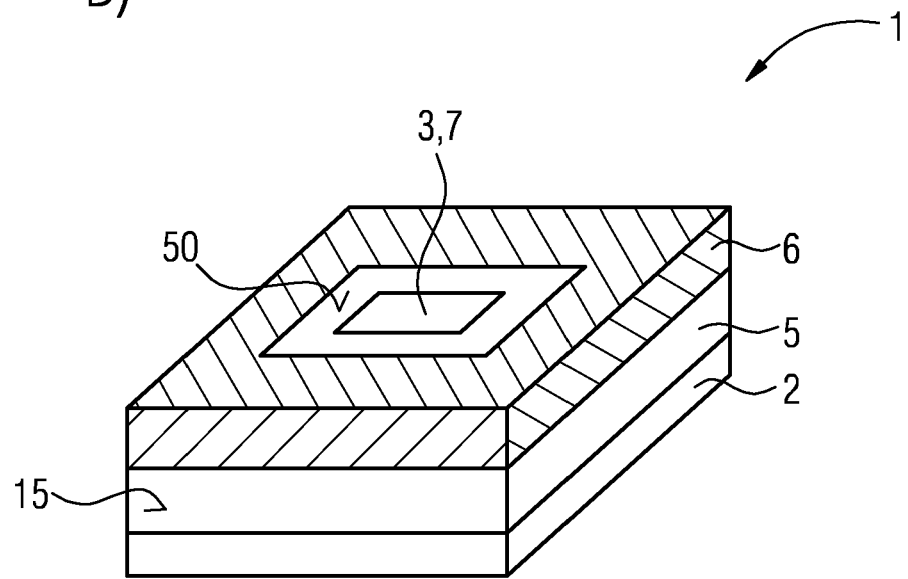

In the case of the embodiment of FIG. 7, formed in the panel is a contiguous supporting body 6, which surrounds the respective semiconductor chips 3 or picture elements 33 in a frame-shaped manner. Since, in particular directly on the carrier 2, the potting 5 is a contiguous layer, in the not yet singulated state the potting 5 is also formed in one piece over all of the semiconductor components 1.

Consequently, also in the finished semiconductor components 1, see FIG. 7B, the supporting body 6 surrounds the potting 5 and also the semiconductor chip 3 on the top side in a frame-shaped manner.

Figure 4:
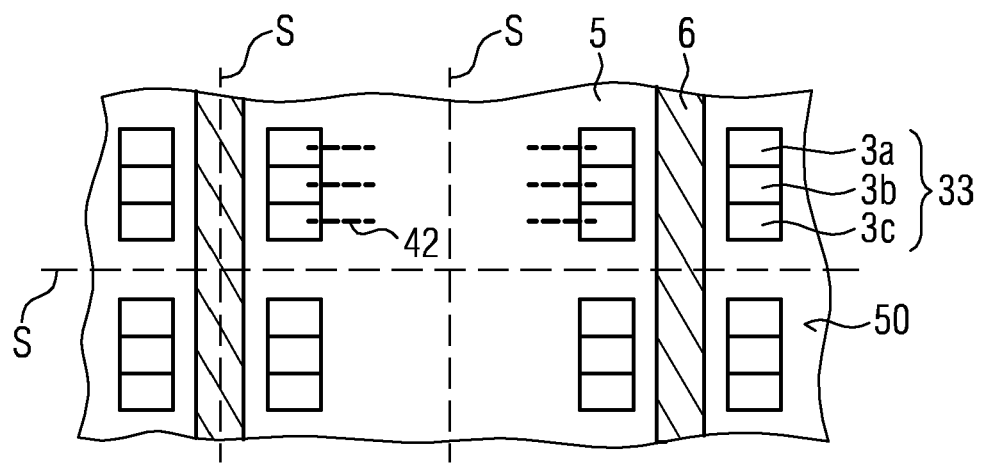
FIGS. 4 to 9 show in figure parts A schematic plan views of panels produced by a method described here, with a multiplicity of non-singulated semiconductor components, and in figure parts B perspective representations of exemplary embodiments of optoelectronic semiconductor components described here.
Figure 4:
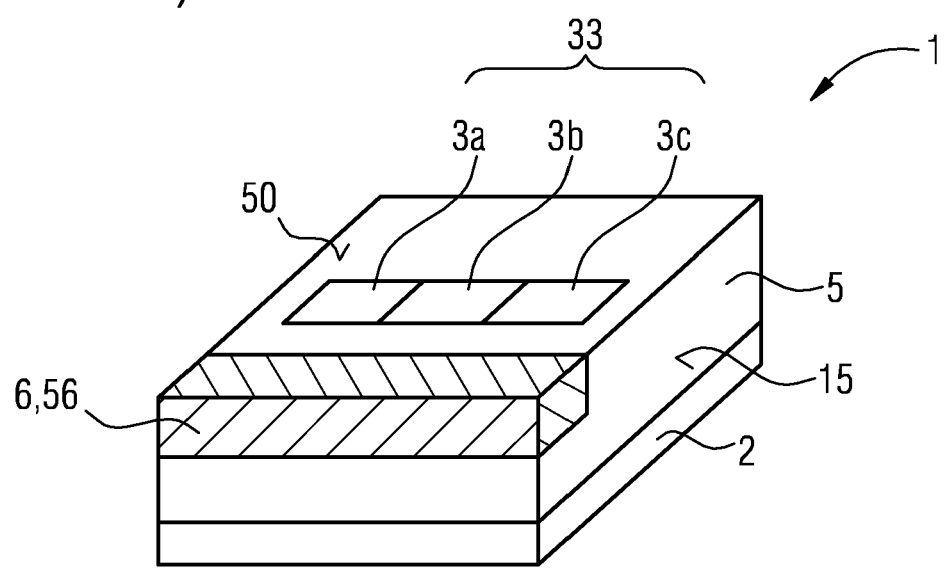

In FIGS. 4 to 6, the phosphor bodies 7 are not separately depicted, but may each be present in the same way, as in FIG. 7.

According to FIG. 8A, the singulation lines S do not run through the supporting body 6, but are confined to the potting 5 and optionally to the carrier 2. If it is a QFN component, so that the carrier 2 is a leadframe, the singulation lines S may be confined to the potting 5. In this case, narrow connecting webs between individual leadframe parts that are possibly present but are not depicted are disregarded. Consequently, the side faces 15 may consist of the potting material of the potting 5, see FIG. 8B, while disregarding possibly severed connecting webs. Also the semiconductor components 1, as shown in the other figures, may be configured differently than the respective representation as QFN components in a way corresponding to FIG. 7.

Figure 8:
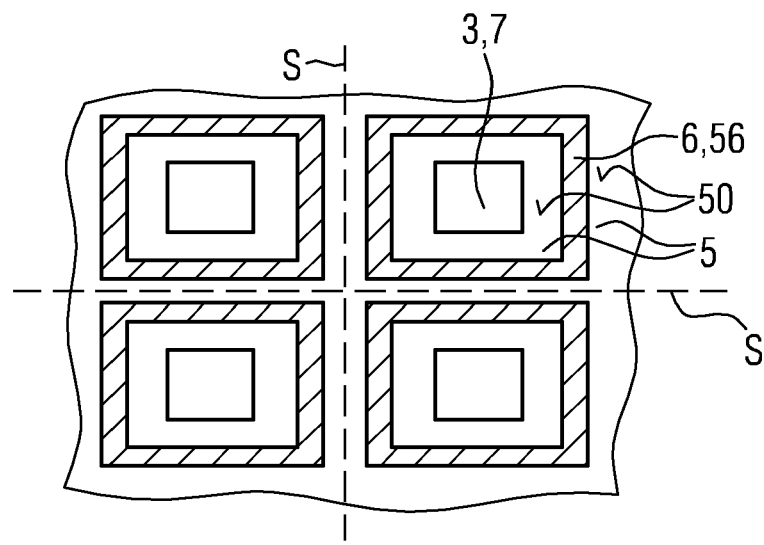
Figure 8:
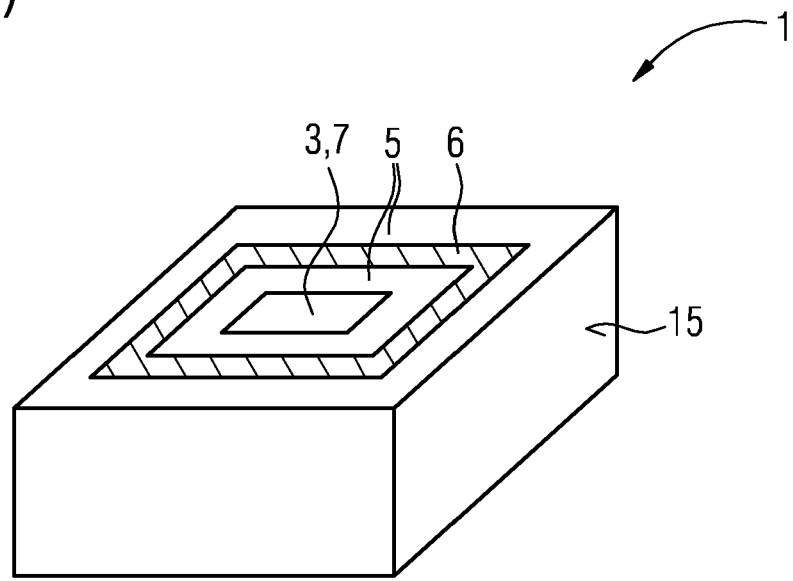

The supporting body 6 encloses the individual semiconductor chips 3 according to FIG. 8 in each case completely in the form of a frame, in particular a rectangular frame. In this case, the supporting body 6 may, as in FIG. 1, partly penetrate the potting 5 or else run completely through the potting 5, as described for instance in FIG. 2C or 2E. Furthermore, it is possible that the supporting body 6, seen from above, is designed in a way corresponding to FIGS. 4 to 6.

As a departure from the representation in FIG. 8, it is possible that between the individual frame-shaped supporting bodies 6 there are connecting channels (not depicted), so that a number of the supporting bodies 6 can be injection-molded together. The singulation lines S then run through such connecting channels, in particular perpendicularly to such connecting channels.

Figure 9:
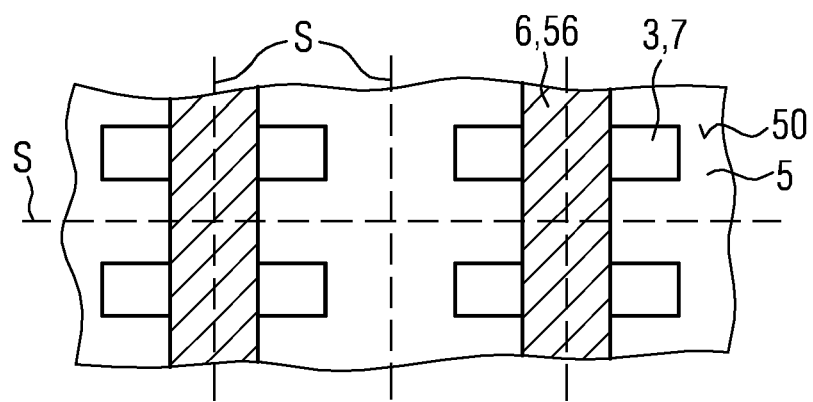
Figure 9:
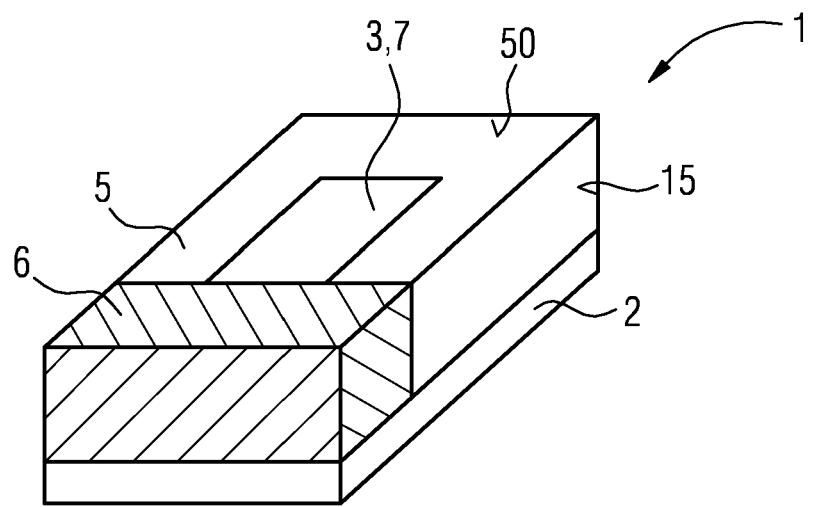

In FIGS. 9A and 9B, it is illustrated that the trenches 56 reach directly as far as the semiconductor chips 3. In this case, the trenches 56 may be confined to one side of the semiconductor chips 3, in a way analogous to FIG. 4, but they may equally extend over a number of sides of the semiconductor chips 3, as shown in conjunction with FIGS. 5 to 7.

The supporting body 6 may reach as far as the carrier 2, see FIG. 9B, so that one of the side faces 15 is formed by the supporting body 6 and optionally together with the carrier 2. As a departure from this, the trenches 56 may also only run partly through the potting 5, in a way corresponding to the design in FIG. 4.

Unless otherwise indicated, the components shown in the figures respectively follow one another directly in the order specified. Layers which do not touch one another in the figures are separated from one another. If lines are shown as being parallel to one another, the corresponding surfaces are likewise directed parallel to one another. Likewise, unless otherwise indicated, the relative positions of the components shown with respect to one another are reproduced correctly in the figures.

The invention described here is not restricted by the description on the basis of the exemplary embodiments. Rather, the invention includes every novel feature and every combination of features, which includes in particular any combination of features in the patent claims, even if this feature or this combination itself is not explicitly specified in the patent claims or exemplary embodiments.

This patent application is claiming the priority of the German patent application 10 2017 117 150.9, the disclosure content of which is hereby incorporated by reference.

LIST OF REFERENCE SIGNS

1 Optoelectronic semiconductor component
15 Side face of the semiconductor component
2 Carrier
27 Anchoring elements
3 Semiconductor chip
33 Picture element
30 Chip top side
41 Electrical contact area
42 Bonding wire
5 Potting
50 Potting top side
51 Peripheral rounding
55 Branch
56 Trench
57 Anchoring structure
58 Roughening
59 Trench side wall
6 Supporting body
7 Phosphor body
81 Compression mold
82 Sheet molding compound
83 Further compression mold
84 Further sheet molding compound
85 Cavity
9 Saw blade
R Radiation
S Singulation line
α Angle between potting top side and trench side wall

The invention claimed is:

1. A method for producing optoelectronic semiconductor components, wherein the method in sequential order of:
applying optoelectronic semiconductor chips for generating radiation to a carrier; wherein the optoelectronic semiconductor chips have a bottom side arranged directly on the carrier and a top side opposite the bottom side;
producing a reflective potting with a potting top side facing away from the carrier directly around the optoelectronic semiconductor chips, so that the top side of optoelectronic semiconductor chips remains free of the reflective potting,
wherein the reflective potting comprises silicone;
wherein the reflective potting has trenches between the optoelectronic semiconductor chips,
wherein the trenches are arranged at a distance from the associated optoelectronic semiconductor chips, and wherein the trenches do not touch the optoelectronic semiconductor chips,
filling the trenches with a supporting material to form at least one supporting body and leaving the potting alongside the trenches free of the supporting material; wherein the supporting material comprises a different material from the reflective potting; wherein the supporting material comprises epoxy; wherein the supporting material has an absorption coefficient with respect to the radiation of at least 0.8; and
singulating the optoelectronic semiconductor components through the supporting material in the trenches; and
further comprising arranging a phosphor body on a top side of the respective optoelectronic semiconductor chips facing away from the carrier; wherein the phosphor body is separate from the reflective potting material.

2. The method as claimed in claim 1, wherein:
the trenches penetrate the reflective potting by at least 40% in a direction perpendicular to the carrier from the potting top side,
a lateral distance between the optoelectronic semiconductor chips and the trenches on the potting top side ranges from 30 μm to 250 μm, inclusive, wherein the reflective potting has a transmissivity with respect to the radiation of at least 0.5% and of at most 5% on the potting top side,
a phosphor body is respectively arranged on the top sides of the respective optoelectronic semiconductor chips facing away from the carrier,
the phosphor bodies are flush with the potting top side and also the supporting body, the carrier is present in the finished optoelectronic semiconductor components and comprises electrical contact areas for the optoelectronic semiconductor chips,
the reflective potting is applied directly to the carrier, and
the trenches are kept at a distance from the optoelectronic semiconductor chips, so that the supporting body does not touch the optoelectronic semiconductor chips.

3. The method as claimed in claim 1,
wherein the reflective potting is produced by a film-assisted transfer molding and/or film-assisted injection molding,
wherein the trenches are formed with the film-assisted injection molding or film-assisted transfer molding, such that no reflective potting material is subsequently removed.

4. The method as claimed in claim 3,
wherein at least one anchoring structure is formed in the trenches on the reflective potting during the producing of the reflective potting, wherein a bonding attachment of the supporting body to the reflective potting is increased by the anchoring structure.

5. The method as claimed in claim 1,
wherein the reflective potting is produced with a uniform thickness, and
wherein, the trenches are formed by sawing the reflective potting.

6. The method as claimed in claim 5,
wherein a roughening is produced in the trenches during the sawing and the roughening has an average roughness ranging from 5 µm to 40 µm, inclusive.

7. The method as claimed in claim 1,
wherein side walls of the trenches form an angle ranging from 95° to 135°, inclusive, with the potting top side,
wherein peripheral roundings with a radius of curvature ranging from 10 µm to 50 µm, inclusive, are respectively formed along edges of the trenches.

8. The method as claimed in claim 1,
wherein the trenches are additionally roughened after the producing of the reflective potting and before the filling of the trenches.

9. The method as claimed in claim 1,
wherein the trenches penetrate the reflective potting from the reflective potting top side by at least 45% and by at most 70%,
wherein the trenches are filled flush and completely with the supporting material.

10. The method as claimed in claim 1,
wherein the trenches penetrate the reflective potting from the potting top side completely as far as the carrier, wherein the carrier is at least partially exposed,
wherein at least one anchoring element is arranged in each trench for increasing a bonding attachment of the supporting body to the carrier.

11. The method as claimed in claim 1,
wherein the trenches extend contiguously over a number of the optoelectronic semiconductor components prior to singulating the optoelectronic semiconductor components,
wherein adjacent trenches neither touch nor intersect, such that one supporting body per trench is formed during the filling of the trenches with the supporting material.

12. The method as claimed in claim 1,
wherein the trenches have a multiplicity of branches in a direction transverse to a longitudinal direction, wherein the optoelectronic semiconductor chips are surrounded on at least three sides by the related trench together with two of the branches of the multiplicity of branches.

13. The method as claimed in claim 1,
wherein, during the singulating the optoelectronic semiconductor components, at least one singulation line runs completely alongside the trenches and the supporting body is not affected by the singulation line.

14. The method as claimed in claim 1,
wherein the optoelectronic semiconductor chips are grouped into picture elements prior to the filling of the trenches, which are configured for colored light emission that can be set, wherein no trench is produced between the optoelectronic semiconductor chips within the picture elements.

15. The method as claimed in claim 1, wherein the trenches are completely filled with the supporting material, and wherein an optoelectronic semiconductor component of the optoelectronic semiconductor components comprises a portion of the supporting material after the singulating occurs.

16. A method for producing optoelectronic semiconductor components, wherein the method in sequential order of:
applying optoelectronic semiconductor chips for generating radiation to a carrier; wherein the optoelectronic semiconductor chips have a bottom side arranged directly on the carrier and a top side opposite the bottom side;
producing a reflective potting with a potting top side facing away from the carrier directly around the optoelectronic semiconductor chips, so that the top side of optoelectronic semiconductor chips remains free of the reflective potting, wherein the reflective potting has trenches between the optoelectronic semiconductor chips, wherein the reflective potting comprises silicone; wherein the trenches are arranged at a distance from the associated optoelectronic semiconductor chips, and wherein the trenches do not touch the optoelectronic semiconductor chips,
filling the trenches with a supporting material to form at least one supporting body and leaving the reflective potting alongside the trenches free of the supporting material; wherein the supporting material comprises a different material from the reflective potting; wherein the supporting material comprises epoxy; wherein the supporting material has an absorption coefficient with respect to the radiation of at least 0.8; wherein the supporting material comprises carbon black; and
singulating the optoelectronic semiconductor components through the supporting material in the trenches; and
further comprising arranging a phosphor body on a top side of the respective optoelectronic semiconductor chips facing away from the carrier; wherein the phosphor body is separate from the reflective potting material.

17. The method as claimed in claim 1, further comprising forming the trenches at a side of the optoelectronic semiconductor chips opposite to the carrier.

* * * * *